United States Patent
Soejima et al.

(10) Patent No.: US 8,385,377 B2
(45) Date of Patent: Feb. 26, 2013

(54) SEMICONDUCTOR LASER DEVICE

(75) Inventors: Kazuhiro Soejima, Miyagi-ken (JP); Takuya Nagai, Miyagi-ken (JP); Toru Yoshida, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/198,443

(22) Filed: Aug. 4, 2011

(65) Prior Publication Data
US 2012/0033700 A1    Feb. 9, 2012

(30) Foreign Application Priority Data

Aug. 4, 2010   (JP) ................................ 2010-174973

(51) Int. Cl.
*H01S 3/10*       (2006.01)
*G02B 26/02*      (2006.01)

(52) U.S. Cl. ............. 372/22; 372/21; 359/326; 359/328
(58) Field of Classification Search .............. 372/21–22, 372/38.1–38.02; 359/326, 328
See application file for complete search history.

(56) References Cited

U.S. PATENT DOCUMENTS

| | | | | |
|---|---|---|---|---|
| 5,436,920 | A * | 7/1995 | Minemoto et al. ............... | 372/21 |
| 5,712,723 | A * | 1/1998 | Lee ............... | 359/328 |
| 5,801,402 | A * | 9/1998 | Shin ............... | 257/80 |
| 6,031,856 | A * | 2/2000 | Wu et al. .................... | 372/43.01 |
| 7,192,153 | B2 * | 3/2007 | Aoshima et al. ............. | 362/109 |
| 7,817,176 | B2 | 10/2010 | Masuda | |
| 2004/0182929 | A1 * | 9/2004 | Aoshima et al. ............... | 235/454 |
| 2005/0163176 | A1 * | 7/2005 | You et al. ........................ | 372/36 |
| 2008/0259975 | A1 * | 10/2008 | Kamijima ...................... | 372/23 |
| 2009/0103574 | A1 * | 4/2009 | Park ................................ | 372/4 |
| 2010/0290488 | A1 * | 11/2010 | Ko et al. ......................... | 372/22 |

FOREIGN PATENT DOCUMENTS

| | | |
|---|---|---|
| JP | 7-326319 | 12/1995 |
| JP | 2004-281932 | 10/2004 |
| JP | 2007-185850 | 7/2007 |
| JP | 2008-275505 | 11/2008 |

* cited by examiner

*Primary Examiner* — Jessica Stultz
*Assistant Examiner* — Phillip Nguyen
(74) *Attorney, Agent, or Firm* — Brinks Hofer Gilson & Lione (57) ABSTRACT

A semiconductor laser device includes a semiconductor laser element configured to emit a fundamental wave; a transducer configured to receive the fundamental wave incident thereon and convert a wavelength of the fundamental wave to emit wavelength converted light; a filter configured to selectively transmit wavelength range light having a desired wavelength range of the wavelength converted light; a sealing member including a light-transmitting member and configured to enclose the semiconductor laser element, the light-transmitting member being configured to receive the wavelength range light transmitted through the filter and incident on the light-transmitting member, specularly reflect part of the wavelength range light, and substantially transmit the remaining part of the wavelength range light; and a photoreceptor configured to receive the specularly reflected light from the light-transmitting member.

6 Claims, 7 Drawing Sheets

SEMICONDUCTOR LASER DEVICE

CLAIM OF PRIORITY

This application claims benefit of Japanese Patent Application No. 2010-174973 filed on Aug. 4, 2010, which is hereby incorporated by reference in its entirety.

BACKGROUND

1. Field of the Disclosure

The present disclosure relates to a semiconductor laser device that converts a wavelength of light emitted by a semiconductor laser. In particular, the present disclosure relates to a semiconductor device used, for example, in an optical recording apparatus, a measuring instrument, or a business machine.

2. Description of the Related Art

Figure 6:
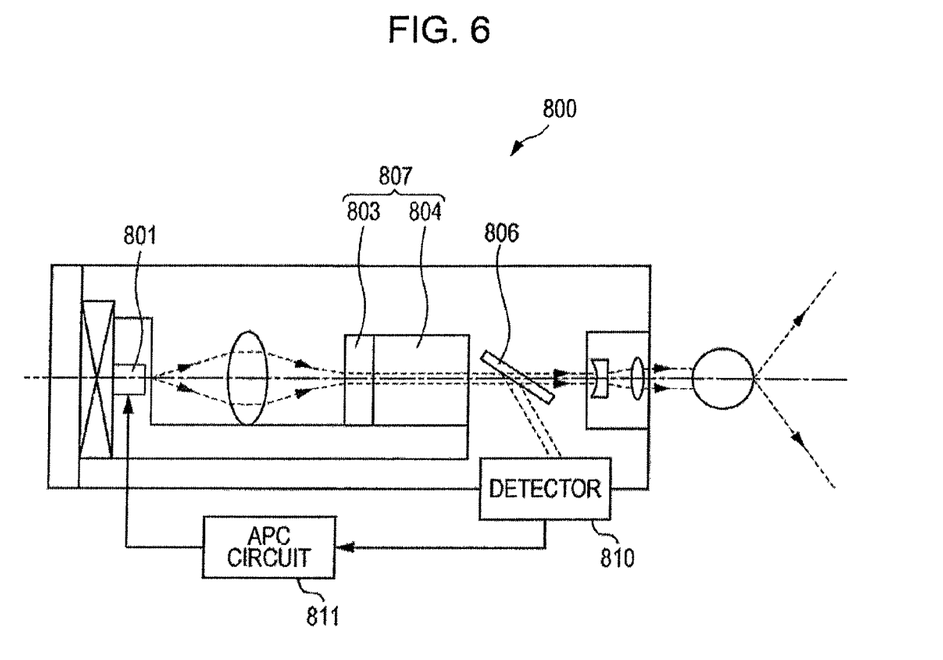
FIG. 6 is a schematic view illustrating a configuration of related art.

In recent years, because of features such as small size, high efficiency, and high directivity, a semiconductor laser has been used in a wide range of applications including an optical recording apparatus, a measuring instrument, a printer, a medical device, and a business machine. In particular, using a semiconductor laser in a laser pointer, which requires small size and high directivity, is well known. Japanese Registered Utility Model No. 3123345 proposes a laser pointer that uses laser light having a wavelength range with relative luminosity higher than that of red light generally used. FIG. 6 illustrates a laser pointer 800 in which an optical resonator 807 includes a solid laser medium 803 and a nonlinear optical element 804. The solid laser medium 803 is excited by light emitted from a semiconductor laser 801. The nonlinear optical element 804 converts a wavelength of light generated by excitation of the solid laser medium 803. With this configuration, laser light is output, which has a wavelength shorter than that of red light.

In the technique of wavelength conversion realized by the semiconductor laser 801, the solid laser medium 803, and the nonlinear optical element 804, the luminous efficiency depends largely on the temperature. This means that self-heating and the external environment may cause unstable laser output. Therefore, as illustrated in FIG. 6, the laser pointer 800 proposed by Japanese Registered Utility Model No. 3123345 includes an automatic power control (APC) circuit 811 for stable light output. The APC circuit 811 has a feedback mechanism in which output light from the optical resonator 807 is partially reflected by a beam splitter 806 and is incident on a detector 810, so that the output of light can be stabilized on the basis of output from the detector 810.

In monitoring of output light for the APC function according to related art, emitted light that leaks backward is monitored in an edge-emitting semiconductor laser (see, e.g., Japanese Unexamined Patent Application Publication No. 2008-275505), whereas diffuse reflected light reflected back from a cover glass on a laser aperture is monitored in a surface-emitting semiconductor laser where there is no backward leakage of emitted light (see, e.g., Japanese Unexamined Patent Application Publication No. 2007-185850). However, when light emitted from the semiconductor laser is used as a fundamental wave and wavelength-converted by a transducer, since the temperature dependency of luminous efficiency with the transducer is not uniform, output light cannot be accurately controlled by monitoring the light emitted from the semiconductor laser. Therefore, in the technique of Japanese Registered Utility Model No. 3123345, light converted by a transducer is monitored.

Figure 7:
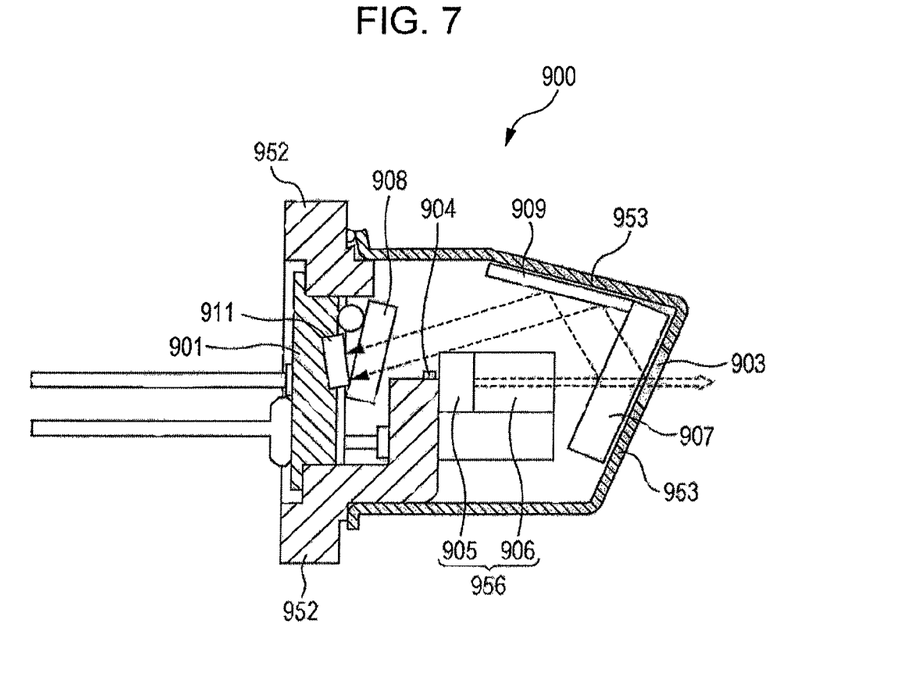
FIG. 7 is a schematic view illustrating another configuration of related art.

Japanese Unexamined Patent Application Publication No. 2004-281932 proposes a method which does not involve use of a beam splitter. FIG. 7 illustrates a laser emitting module 900 in which an optical resonator 956 includes a solid laser medium 905 and a nonlinear optical element 906. The solid laser medium 905 is excited by light emitted from a laser diode 904. The nonlinear optical element 906 converts a wavelength of light generated by excitation of the solid laser medium 905. With this configuration, laser light is output, which has a wavelength shorter than that of red light.

Monitoring of output light for the APC function is performed by a process in which output light from the optical resonator 956 is partially specularly reflected by an optical filter 907 on a laser aperture, further reflected by a reflecting mirror 909 held by a window cap 953, passed through an optical filter 908, and is incident on a photodiode 911 mounted on a header 901. Thus, from the light emitted by the optical resonator 956, a fundamental wave from the laser diode 904 and a wave excited by the solid laser medium 905 are eliminated by the optical filter 907 and the optical filter 908. This means that the light that reaches the photodiode 911 contains only a desired converted wave. Therefore, with the APC function, it is possible to accurately control the laser diode 904, efficiently emit a desired converted wave from a window 903, and stabilize the output of the converted wave.

In the related art disclosed in Japanese Registered Utility Model No. 3123345, output light from the optical resonator 807 is directly split by the beam splitter 806 and is incident on the detector 810. In this technique, the incident output light contains not only a desired converted wave, but also a fundamental wave of the semiconductor laser 801 and a wave exited by the solid laser medium 803. Therefore, these undesired waves affect the detector 810 as noise and send a false signal to the APC function. As a solution to this, a filter that eliminates such undesired waves may be added between the optical resonator 807 and the beam splitter 806. However, this not only increases the number of components and costs, but also hinders size reduction.

In the related art disclosed in Japanese Unexamined Patent Application Publication No. 2004-281932, an optical path of output light from the optical resonator 956 is altered and the light is passed through the optical filter 907 and the optical filter 908, so that only a desired converted wave is incident on the photodiode 911. However, altering the optical path of output light requires the window cap 953 of complex shape. Therefore, joining the window cap 953 to a flange 952 of a heat sink requires adjustment of the optical axis which involves both horizontal and rotational positioning. At the same time, using the additional optical filter 908 for complete elimination of the undesired waves and the reflecting mirror 909 for backward reflection results in an increased number of components and increased costs.

The present invention has been made to solve the problems described above. The present invention provides a semiconductor laser device which is compact, allows easy adjustment of the optical axis, and requires no additional components for monitoring output light for the APC function.

SUMMARY

A semiconductor laser includes a semiconductor laser element configured to emit a fundamental wave; a transducer configured to receive the fundamental wave incident thereon and convert a wavelength of the fundamental wave to emit wavelength converted light; a filter configured to selectively transmit wavelength range light having a desired wavelength range of the wavelength converted light; a sealing member including a light-transmitting member and configured to enclose the semiconductor laser element, the light-transmitting member being configured to receive the wavelength range light transmitted through the filter and incident on the light-transmitting member, specularly reflect part of the wavelength range light, and substantially transmit the remaining part of the wavelength range light; and a photoreceptor configured to receive the specularly reflected light from the light-transmitting member.

In the semiconductor laser device of the above-described aspect, the wavelength range light transmitted through the filter is partially specularly reflected by the light-transmitting member, and the specularly reflected light is received by the photoreceptor. Therefore, no additional component, such as a beam splitter, is required to monitor the output light for the APC function. Also in the semiconductor laser device, the filter and the light-transmitting member, which is part of the sealing member, are used to monitor the output light. Therefore, unlike in the case where a combination of reflecting mirrors is used to monitor the output light, no complex shapes are required, size reduction is possible, and the optical axis of the specularly reflected light incident on the photoreceptor is easily adjustable. Moreover, since the desired wavelength range light transmitted through the filter is monitored, a high level of monitoring accuracy can be achieved, because the wavelength range light does not contain the fundamental wave and wavelength converted light of undesired wavelengths.

DESCRIPTION OF THE EXEMPLARY EMBODIMENTS

Embodiments of the present invention will now be described in detail with reference to the attached drawings.

First Embodiment

Figure 1:
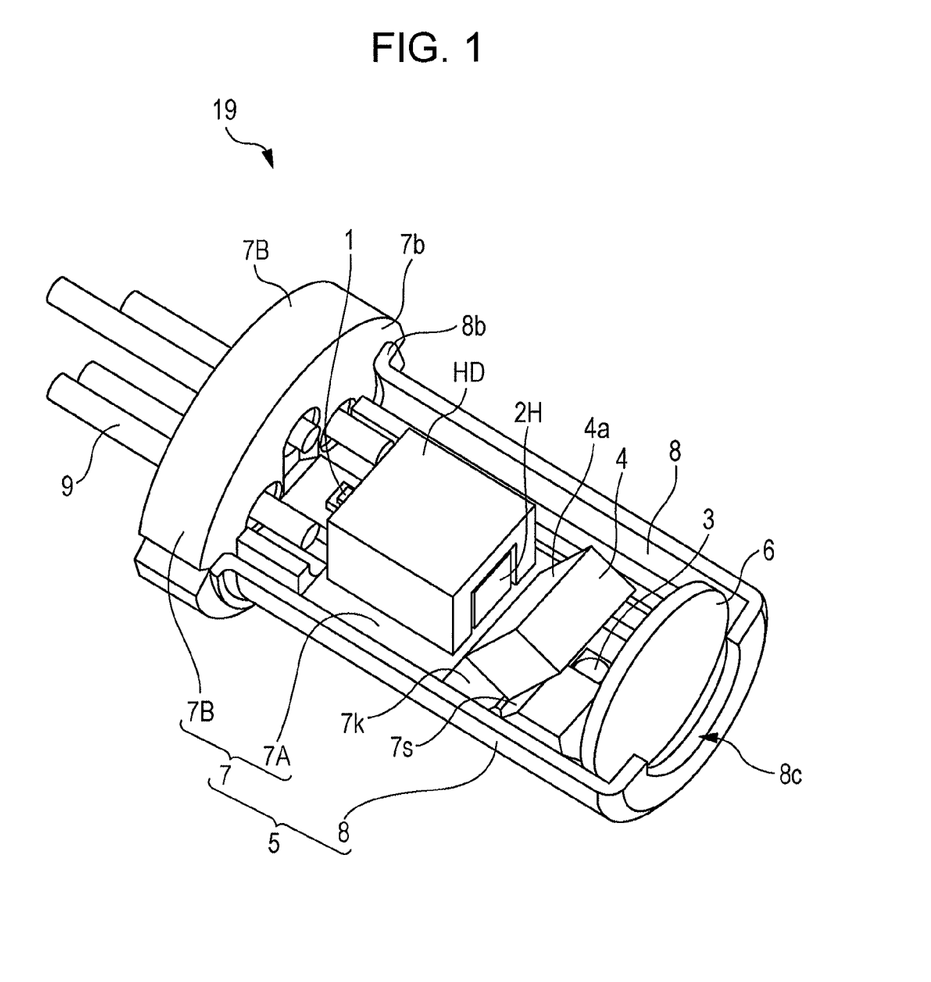
FIG. 1 is a perspective view illustrating a configuration of a semiconductor laser device according to a first embodiment of the present invention.
Figure 2:
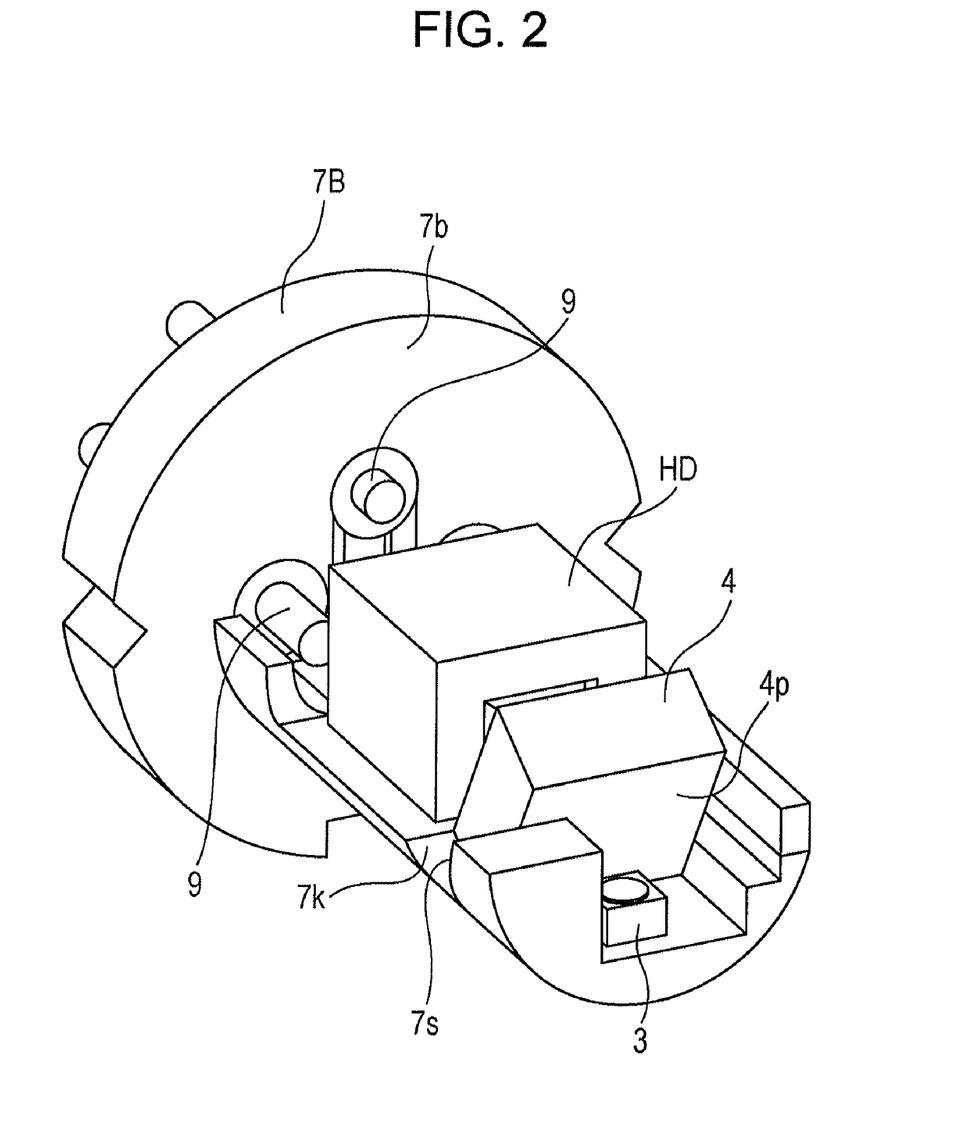
FIG. 2 is an enlarged perspective view of a transducer, a filter, and a photoreceptor of the semiconductor laser device according to the first embodiment.
Figure 3:
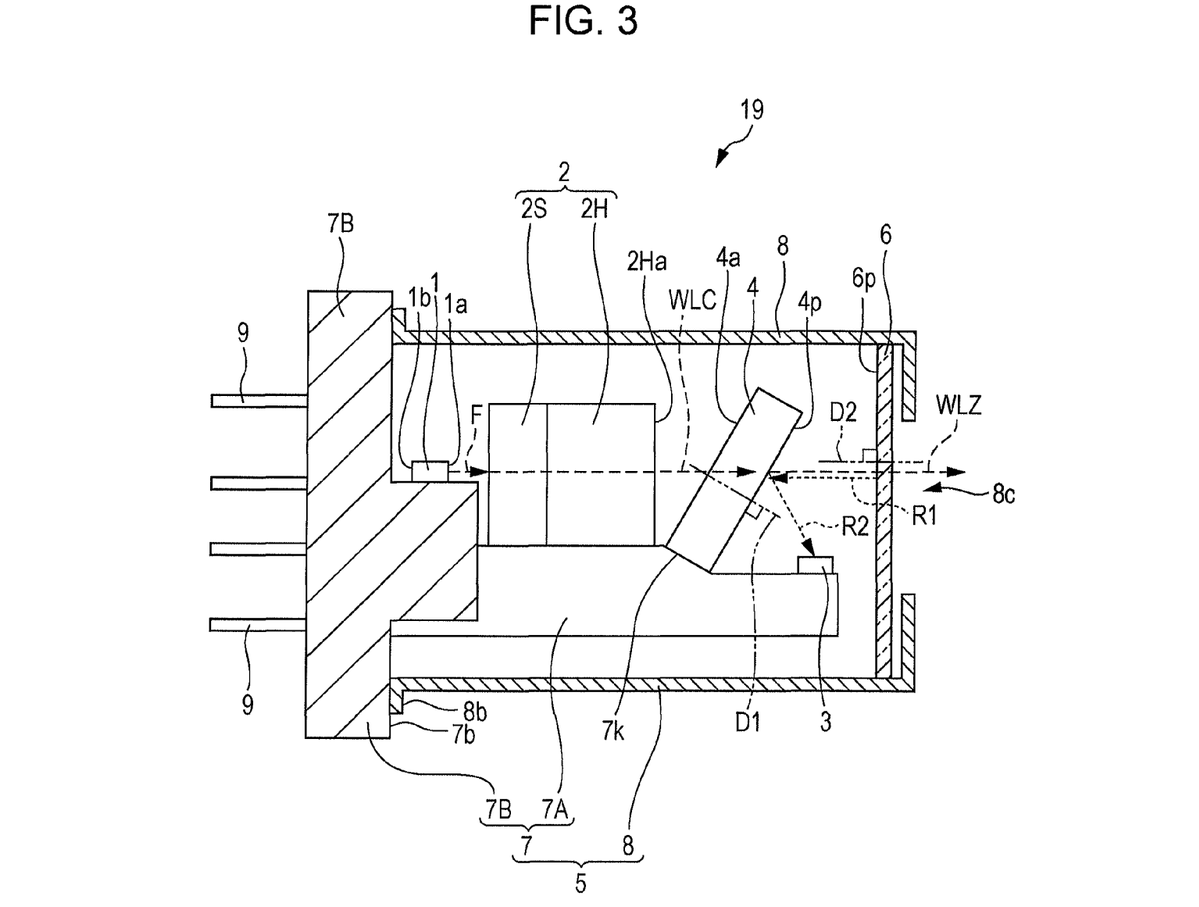
FIG. 3 is a schematic view illustrating optical paths in the semiconductor laser device of the first embodiment.

FIG. 1 is a perspective view illustrating a configuration of a semiconductor laser device 19 according to a first embodiment of the present invention. For simplicity, a case 8 included in a sealing member 5 is partially omitted in FIG. 1. FIG. 2 is an enlarged perspective view of a transducer 2, a filter 4, and a photoreceptor 3 of the semiconductor laser device 19 according to the first embodiment. Again, for simplicity, a light-transmitting member 6 and the case 8 are omitted in FIG. 2. FIG. 3 is a schematic view illustrating optical paths in the semiconductor laser device 19 of the first embodiment. Again, for simplicity, a base member 7 is partially omitted in FIG. 3.

As illustrated in FIG. 1 to FIG. 3, the semiconductor laser device 19 includes a semiconductor laser element 1 that emits a fundamental wave F; the transducer 2 that receives the fundamental wave F incident thereon and converts the wavelength of the fundamental wave F to emit wavelength converted light WLC; the filter 4 that selectively transmits wavelength range light WLZ in a desired wavelength range of the wavelength converted light WLC; the light-transmitting member 6 that receives the wavelength range light WLZ transmitted through the filter 4 and incident on the light-transmitting member 6, specularly reflects part of the wavelength range light WLZ, and substantially transmits the remaining part of the wavelength range light WLZ; and the photoreceptor 3 that receives specularly reflected light R specularly reflected from the light-transmitting member 6. The semiconductor laser element 1, the transducer 2, the filter 4, and the photoreceptor 3 are enclosed in the light-transmitting member 6 and the sealing member 5.

Optical paths in the semiconductor laser device 19 of the first embodiment will now be described. As illustrated in FIG. 3, in the semiconductor laser device 19, the fundamental wave F emitted from the semiconductor laser element 1 is incident on a solid laser 2S, which is thus excited. Fundamental-wave converted light generated by the excitation is converted to second-harmonic laser light by a nonlinear optical element 2H and emitted from the transducer 2. The wavelength converted light WLC emitted from the transducer 2 contains not only the second-harmonic laser light, which is the desired wavelength range light WLZ, but also the fundamental wave F, the fundamental-wave converted light, and higher-order harmonics. Of these components, only the second-harmonic laser light, which is the desired wavelength range light WLZ, is transmitted by the filter 4. The wavelength range light WLZ transmitted through the filter 4 is passed through the light-transmitting member 6 and emitted outside the semiconductor laser device 19. The wavelength range light WLZ transmitted through the filter 4 may be partially specularly reflected by the light-transmitting member 6 as first reflected light R1, which is the specularly reflected light R specularly reflected from the light-transmitting member 6. Then, the first reflected light R1 may be specularly reflected by the filter 4 as second reflected light R2, which is the specularly reflected light R. The photoreceptor 3 is disposed at a position where it can receive the second reflected light R2. Note that the fundamental wave F, the wavelength converted light WLC, the wavelength range light WLZ, the first reflected light R1, and the second reflected light R2 in the drawing represent optical paths, but do not represent all light beams. The same applies to the corresponding drawings for the other embodiments of the present invention.

The semiconductor laser element 1 is preferably an element that emits, as the fundamental wave F, visible light such as blue light with a wavelength of 445 nm or red light with a wavelength of 670 nm, or infrared light with a wavelength of 808 nm or 1064 nm. For transmitting the fundamental wave F as illustrated in FIG. 3, an end surface 1a of the semiconductor laser element 1 facing the solid laser 2S is coated with a low-reflection multilayer coating of insulating materials, such as $Al_2O_3/Si$ or $SiO_2/Ta_2O_5$. For reflecting the fundamental wave F, an end surface 1b of the semiconductor laser element 1 opposite the end surface 1a is coated with a high-reflection multilayer coating of insulating materials, such as $Al_2O_3/Si$ or $SiO_2/Ta_2O_5$. The level (high or low) of reflection of the fundamental wave F can be changed by varying the design, such as the combination of coating films, film thickness, and the number of layers.

As illustrated in FIG. 3, the transducer 2 may include the solid laser 2S and the nonlinear optical element 2H which are disposed on a sub-base member 7A. The transducer 2 is only partially shown in FIG. 1 and FIG. 2, as it is secured and covered with a holder HD having a function of cooling the transducer 2. The solid laser 2S is excited by the fundamental wave F incident thereon. The solid laser 2S emits fundamental-wave converted light, for example, with a wavelength of 1064 nm or 946 nm generated by the excitation. For example, if the solid laser 2S is made of Nd:YAG crystal, the solid laser 2S receives the fundamental wave F of 808 nm incident thereon and emits fundamental-wave converted light of 1064 nm.

The nonlinear optical element 2H converts the fundamental-wave converted light emitted from the solid laser 2S to second-harmonic laser light, and emits it from the transducer 2. The nonlinear optical element 2H can be made of $LiNbO_3$, $LiTaO_3$, $KNbO_3$, $KTiOPO_4$ (KTP), $LiB_3O_5$ (LBO), or $BaB_2O_4$ (BBO). In particular, using $LiNbO_3$, $LiTaO_3$, or $KTiOPO_4$ (KTP) provides a polarization inversion structure, realizes a very large nonlinear optical constant, and makes it possible to achieve high wavelength conversion efficiency. For example, if the solid laser 2S made of Nd:YAG crystal is excited by the fundamental wave F of 808 nm incident thereon and fundamental-wave converted light of 1064 nm generated by the excitation is emitted, the nonlinear optical element 2H made of $KTiOPO_4$ (KTP) converts the fundamental-wave converted light of 1064 nm to a second harmonic of 532 nm, which is the desired wavelength range light WLZ, and emits the second harmonic of 532 nm from the transducer 2. Green light with a wavelength of 532 nm, which is highly visible, is suitable for use with a laser pointer, a light source for an image display apparatus, etc. Green light is often generated by second harmonic generation (SHG) which involves use of the nonlinear optical element 2H, as it is difficult for the semiconductor laser element 1 to emit green light. When the transducer 2 for converting the fundamental wave F includes the solid laser 2S and the nonlinear optical element 2H, a high output of the desired wavelength range light WLZ can be obtained.

As illustrated in FIG. 3, an end surface 2Ha of the nonlinear optical element 2H facing the filter 4 is coated with a multilayer coating of, for example, $SiO_2/TiO_2$ or $SiO_2/Ta_2O_5$. With the multilayer coating, the fundamental wave F and the fundamental-wave converted light are highly reflected back to the nonlinear optical element 2H, whereas the second harmonic is highly transmitted. A resonator structure is formed by repeated reflection between the end surface 1b of the semiconductor laser element 1 and the end surface 2Ha of the nonlinear optical element 2H. The level of reflection of the fundamental wave F and the level of transmission of the second harmonic can be changed by varying the design, such as the combination of coating films, film thickness, and the number of layers.

As illustrated in FIG. 3, the filter 4 is adjacent to a side of the transducer 2 from which the wavelength converted light WLC is emitted. As illustrated in FIG. 1 to FIG. 3, the filter 4 may be supported at an angle by an inclined surface 7k of the sub-base member 7A and an inclined portion 7s integral with the sub-base member 7A. The filter 4 illustrated in FIG. 1 to FIG. 3 is inclined 30°. As illustrated in FIG. 3, since the filter 4 is disposed at an angle, a direction D1 normal to an emitting side 4p from which the wavelength range light WLZ is emitted may not be parallel to the optical axial of the wavelength range light WLZ. Then, the first reflected light R1 specularly reflected from the light-transmitting member 6 is specularly reflected by the filter 4 as the second reflected light R2. When the photoreceptor 3 is disposed on the sub-base member 7A, the inclination angle of the filter 4 is preferably in the range of 10° to 80°, or more preferably in the range of 30° to 60°, considering the allowable length of the sub-base member 7A, the mountability of the photoreceptor 3, etc. When the filter 4 is disposed at an angle with respect to the optical axis of the wavelength range light WLZ, the photoreceptor 3 that receives the second reflected light R2 obtained by specular reflection of the first reflected light R1 can be disposed near the filter 4.

The wavelength converted light WLC emitted from the transducer 2 contains the second harmonic, the fundamental wave F, the fundamental-wave converted light, and higher-order harmonics. Of those contained in the wavelength converted light WLC, only the second harmonic, which is the desired wavelength range light WLZ, is transmitted by the filter 4. For example, if the filter 4 is one that transmits only the second harmonic of 532 nm, which is the desired wavelength range light WLZ, and eliminates the fundamental wave F of 808 nm and the fundamental-wave converted light of 1064 nm, a band-pass filter that transmits light with a relatively narrow band of wavelengths around green light with a wavelength of 532 nm is used as the filter 4. A filter appropriate for the wavelength of the desired wavelength range light WLZ is selected each time. Since the specularly reflected light R of the desired wavelength range light WLZ transmitted through the filter 4 is received by the photoreceptor 3, the fundamental wave F, fundamental-wave converted light, and higher-order harmonics are not contained in the specularly reflected light R. Therefore, it is possible to accurately monitor the output light for the APC function.

Although a color glass filter produced by adjusting the composition of optical glass is used as the filter 4 of the present embodiment, various other types of filters, such as a dielectric filter and a filter coated with a multilayer coating, can be used.

A transducer side 4a of the filter 4 adjacent to the transducer 2 may be provided with an antireflective layer coated with a multilayer coating of, for example, $SiO_2/Ta_2O_5$. The antireflective layer suppresses the reflection of the wavelength converted light WLC to 0.2% or less. Thus, since the wavelength converted light WLC is incident on the filter 4 without being reflected by the transducer side 4a, the amount of the wavelength range light WLZ transmitted through the filter 4 increases.

As illustrated in FIG. 3, the light-transmitting member 6 may be disposed such that a direction D2 normal to an incident side 6p where the wavelength range light WLZ is incident on the light-transmitting member 6 is parallel to the optical axis of the wavelength range light WLZ. After the wavelength range light WLZ is transmitted through the filter 4, the light-transmitting member 6 specularly reflects 1% to 5% of the wavelength range light WLZ as the first reflected light R1, and transmits 95% to 99% of the wavelength range light WLZ. As illustrated, the direction D2 and the optical axis of the wavelength range light WLZ are parallel to each other. Therefore, even though the light-transmitting member 6 and the sealing member 5 do not have complex shapes, the first reflected light R1 can be reliably returned to the filter 4.

For enclosure of the semiconductor laser element 1, the transducer 2, the filter 4, and the photoreceptor 3, the light-transmitting member 6 is bonded to the case 8 with low-melting $K_2O$—$PbO$—$SiO_2$ or $Bi_2O_3$—$B_2O_3$ glass. During bonding of the light-transmitting member 6 to the case 8, the direction D2 and the optical axis of the wavelength range light WLZ are made parallel to each other for adjustment of the optical axis of the specularly reflected light R (including the first reflected light R1 and the second reflected light R2) received by the photoreceptor 3. For accurate adjustment of the optical axis, a positioning unit (not shown) may be added to the case 8 in advance. The light-transmitting member 6 is made of borosilicate glass, but the material is not particularly limited to this.

As illustrated in FIG. 2 and FIG. 3, the photoreceptor 3 is disposed on the sub-base member 7A adjacent to the emitting side 4p of the filter 4. The photoreceptor 3 is located at a position where it can receive the second reflected light R2 obtained by specularly reflecting 1% to 5% of the first reflected light R1. The photoreceptor 3 includes a photodiode and transmits information about the amount of received light to the APC function (not shown), through wires (not shown) in the base member 7 and electrodes 9.

The wavelength range light WLZ transmitted through the filter 4 is partially specularly reflected by the light-transmitting member 6, the resulting first reflected light R1 is specularly reflected by the filter 4, and the resulting second reflected light R2 is received and monitored by the photoreceptor 3. Therefore, without an additional component, such as the beam splitter 806 described in Japanese Registered Utility Model No. 3123345, it is possible to monitor the output light for the APC function.

As illustrated in FIG. 1 and FIG. 3, the sealing member 5 may include the base member 7 and the case 8. The base member 7 is made of metal material, such as iron, iron alloy, or brass. The base member 7 includes the sub-base member 7A on which the transducer 2, the filter 4, and the photoreceptor 3 are mounted and a sub-base member 7B on which the semiconductor laser element 1 is mounted. The sub-base member 7A has the inclined surface 7k inclined 30° to allow the filter 4 to be inclined 30°, and the inclined portion 7s having a surface inclined 60°. The inclined portion 7s is formed integrally with the sub-base member 7A and supports one side of the filter 4. Although the inclined portion 7s is provided on only one side of an end portion of the sub-base member 7A, there may be inclined portions 7s on both sides, as long as they do not interfere with passage of the wavelength range light WLZ, the first reflected light R1, and the transducer 2. Also, the shape of the inclined portion 7s is not limited to that illustrated in FIG. 1 and FIG. 3. As described above, the filter 4 is supported at an angle by the inclined surface 7k of the sub-base member 7A and the inclined portion 7s integral with the sub-base member 7A. Therefore, positioning of the filter 4 and setting of the inclination angle of the filter 4 can be made easily and accurately.

The sub-base member 7B is joined to the electrodes 9 for power supply and signal transmission and reception. At the same time, the sub-base member 7B is joined to the case 8 by resistance welding of a sealing surface 7b of the sub-base member 7B to a constricted portion 8b of the case 8. Although resistance welding is used here to ensure easy manufacture and air tightness, the sub-base member 7B may be joined by an adhesive or other means to the case 8. Although the base member 7 is composed of the sub-base member 7A and the sub-base member 7B, the base member 7 may be formed as a single unit or may further include an additional part.

As illustrated in FIG. 1 and FIG. 3, the case 8 has an opening 8c which allows the wavelength range light WLZ transmitted through the light-transmitting member 6 to be emitted outside the semiconductor laser device 19. Like the base member 7, the case 8 is made of metal material, such as iron, iron alloy, or brass. As described above, the filter 4 and the light-transmitting member 6, which is part of the sealing member 5, are used to monitor the output light. Therefore, unlike in the technique disclosed in Japanese Unexamined Patent Application Publication No. 2004-281932 where a combination of reflecting mirrors is used to monitor the output light, the case 8 does not require a complex shape, size reduction is possible, and the optical axis of the specularly reflected light R incident on the photoreceptor 3 is easily adjustable.

For accurate monitoring of the output light for the APC function, the most effective way is to increase the amount of monitoring light received by the photoreceptor 3. This requires a mechanism for accurate reception of monitoring light. In the semiconductor laser device 19 of the present embodiment, the position and the inclination angle of the filter 4 are accurately defined by the sub-base member 7A, and the positional relationship between the filter 4 and the light-transmitting member 6 is determined by accuracy in joining the base member 7 and the case 8 for sealing. Therefore, the accuracy of the distance between the filter 4 and the light-transmitting member 6 can be ensured without requiring the accuracy of the rotational angle of the light-transmitting member 6 with respect to the wavelength range light WLZ, and it is only necessary to ensure angular accuracy of the light-transmitting member 6 in the normal direction with respect to the wavelength range light WLZ. Thus, unlike in the technique disclosed in Japanese Unexamined Patent Application Publication No. 2004-281932, horizontal and rotational positioning for adjustment of the optical axis is not required.

In the semiconductor laser device 19 of the present embodiment, the wavelength range light WLZ transmitted through the filter 4 is partially specularly reflected by the light-transmitting member 6, the resulting first reflected light R1 is specularly reflected by the filter 4, and the resulting second reflected light R2 is received by the photoreceptor 3. Therefore, no additional component, such as a beam splitter, is required to monitor the output light for the APC function. In the present embodiment, the filter 4 and the light-transmitting member 6, which is part of the sealing member 5, are used to monitor the output light. Therefore, unlike in the technique disclosed in Japanese Unexamined Patent Application Publication No. 2004-281932 where a combination of reflecting mirrors is used to monitor the output light, no complex shapes are required, size reduction is possible, and the optical axis of the specularly reflected light R (including the first reflected light R1 and the second reflected light R2) incident on the photoreceptor 3 is easily adjustable. Moreover, since the desired wavelength range light WLZ transmitted through the filter 4 is monitored, a high level of monitoring accuracy can be achieved, because the wavelength range light WLZ does not contain the fundamental wave F, fundamental-wave converted light, and higher-order harmonics. Also, as compared to the case where diffuse reflected light is monitored, a higher level of monitoring accuracy can be achieved because a larger amount of light can be obtained.

Since the filter 4 is disposed at an angle with respect to the optical axis of the wavelength range light WLZ, the photoreceptor 3 that receives the second reflected light R2 obtained by specular reflection of the first reflected light R1 can be disposed near the filter 4. This allows size reduction and easy extraction of wires of the photoreceptor 3.

Since the light-transmitting member 6 is disposed perpendicularly to the optical axis of the wavelength range light WLZ, the light-transmitting member 6 and the sealing member 5 do not require complex shapes. It is thus possible to achieve size reduction and easy adjustment of the optical axis of the specularly reflected light R incident on the photoreceptor 3.

Since the transducer 2 for converting the fundamental wave F includes the solid laser 2S and the nonlinear optical element 2H, a high output of the desired wavelength range light WLZ can be obtained. This increases the amount of the first reflected light R1 and the second reflected light R2. Thus, since a sufficient amount of light for the photoreceptor 3 can be obtained, a high level of monitoring accuracy can be achieved.

Since the transducer side 4a of the filter 4 is provided with the antireflective layer for preventing reflection of the wavelength converted light WLC, the wavelength converted light WLC from the transducer 2 is incident on the filter 4 without being reflected by the transducer side 4a. This increases the amount of the wavelength range light WLZ transmitted through the filter 4, and also increases the amount of the first reflected light R1 and the second reflected light R2. Thus, since a sufficient amount of light for the photoreceptor 3 can be obtained, a high level of monitoring accuracy can be achieved.

With the inclined surface 7k and the inclined portion 7s of the base member 7, the filter 4 can be secured at an angle. This allows easy and accurate positioning of the filter 4. The positional relationship between the filter 4 and the light-transmitting member 6 can be determined by accuracy in joining the base member 7 and the case 8 for sealing. Therefore, it is possible to ensure the accuracy of the distance between the filter 4 and the light-transmitting member 6 without requiring the accuracy of the rotational angle of the light-transmitting member 6 with respect to the wavelength range light WLZ, and it is only necessary to ensure angular accuracy of the light-transmitting member 6 in the normal direction with respect to the wavelength range light WLZ. Thus, it is possible to easily adjust the optical axis of the specularly reflected light R incident on the photoreceptor 3 during joining of the base member 7 and the case 8, obtain a sufficient amount of light for the photoreceptor 3, and achieve a high level of monitoring accuracy.

As described above, the present embodiment provides the semiconductor laser device 19 which is compact, allows easy adjustment of the optical axis, and requires no additional components for monitoring output light for the APC function.

Second Embodiment

Figure 4:
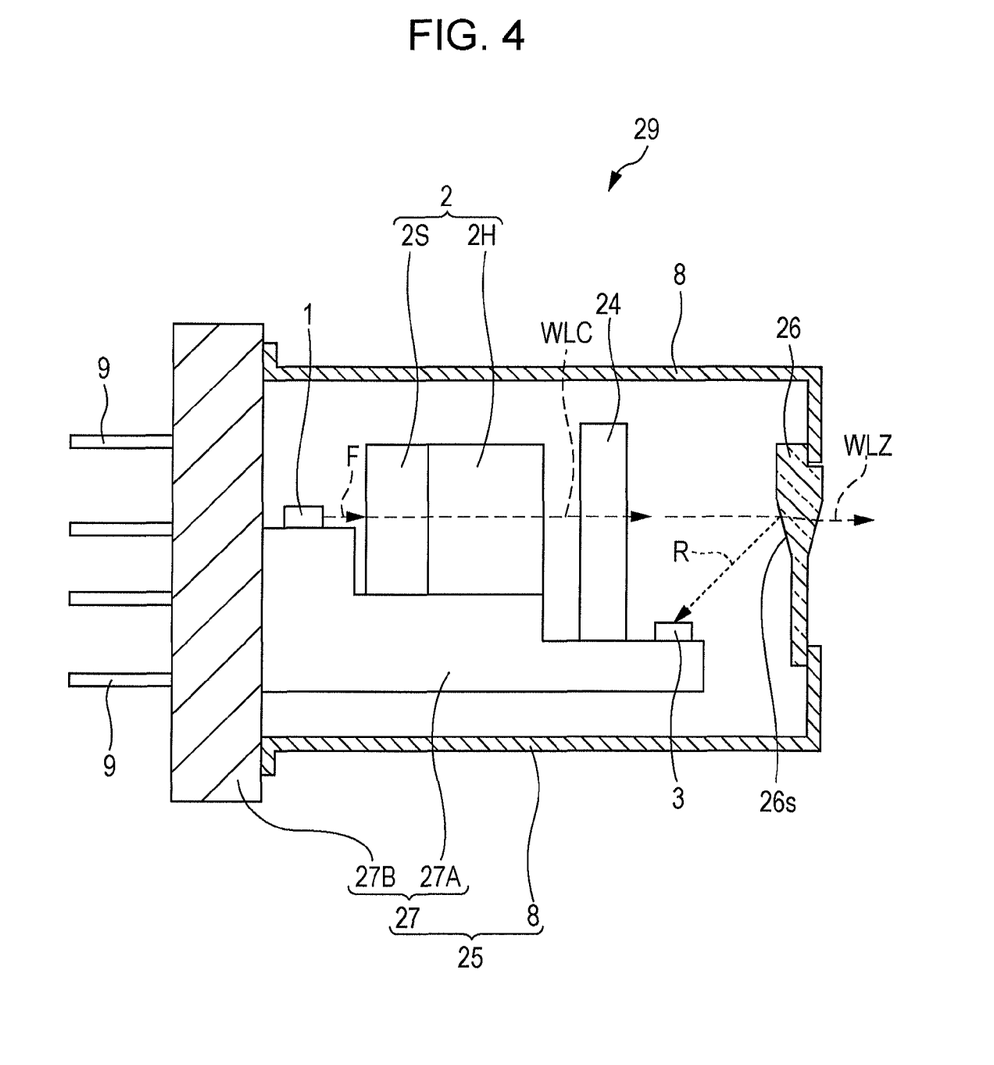
FIG. 4 is a schematic view illustrating a configuration of a semiconductor laser device according to a second embodiment of the present invention.

FIG. 4 is a schematic view illustrating a configuration of a semiconductor laser device 29 according to a second embodiment of the present invention. Differences from the semiconductor laser device 19 of the first embodiment are a light-transmitting member 26, a base member 27 (including a sub-base member 27A and a sub-base member 27B), and a filter 24. For simplicity, a fixed portion of the filter 24 on the sub-base member 27A is omitted. The same components as those of the first embodiment are denoted by the same reference numerals and their description will be omitted.

As illustrated in FIG. 4, in the semiconductor laser device 29, the fundamental wave F emitted from the semiconductor laser element 1 is incident on the solid laser 2S, which is thus excited. Fundamental-wave converted light generated by the excitation is converted to second-harmonic laser light by the nonlinear optical element 2H and emitted from the transducer 2. Depending on the wavelength of the fundamental wave F, for example, in the case of the semiconductor laser element 1 with a wavelength of 1064 nm, the nonlinear optical element 2H can directly convert the fundamental wave F with a wavelength of 1064 nm to a second harmonic of 532 nm, which is the desired wavelength range light WLZ, without using the solid laser 2S.

The wavelength converted light WLC emitted from the transducer 2 contains not only the second-harmonic laser light, which is the desired wavelength range light WLZ, but also the fundamental wave F, the fundamental-wave converted light, and higher-order harmonics. Of these components, only the second-harmonic laser light, which is the desired wavelength range light WLZ, is transmitted by the filter 24. The wavelength range light WLZ transmitted through the filter 24 is passed through the light-transmitting member 26 and emitted outside the semiconductor laser device 29. The wavelength range light WLZ transmitted through the filter 24 is partially specularly reflected by an inclined surface 26s of the light-transmitting member 26 as the specularly reflected light R. The photoreceptor 3 is disposed at a position where it can receive the specularly reflected light R.

In the semiconductor laser device 29, the wavelength range light WLZ is partially specularly reflected by the light-transmitting member 26, and the resulting specularly reflected light R is directly received by the photoreceptor 3. Therefore, if the shape of the light-transmitting member 26 is appropriately designed, the amount of monitoring light received for monitoring the output light for the APC function can be increased, as compared to that in the semiconductor laser device 19 of the first embodiment.

In the semiconductor laser device 29 of the present embodiment, the wavelength range light WLZ transmitted through the filter 24 is partially specularly reflected by the inclined surface 26s of the light-transmitting member 26, and the resulting specularly reflected light R is received by the photoreceptor 3. Therefore, no additional component, such as a beam splitter, is required to monitor the output light for the APC function. In the present embodiment, the light-transmitting member 26, which is part of a sealing member 25, is used to monitor the output light. Therefore, unlike in the case where a combination of reflecting mirrors is used to monitor the output light, no complex shapes are required, size reduction is possible, and the optical axis of the specularly reflected light R incident on the photoreceptor 3 is easily adjustable. Moreover, since the desired wavelength range light WLZ transmitted through the filter 24 is monitored, a high level of monitoring accuracy can be achieved, because the wavelength range light WLZ does not contain the fundamental wave F, fundamental-wave converted light, and higher-order harmonics. Also, as compared to the case where diffuse reflected light is monitored, a higher level of monitoring accuracy can be achieved because a larger amount of light can be obtained.

Third Embodiment

Figure 5:
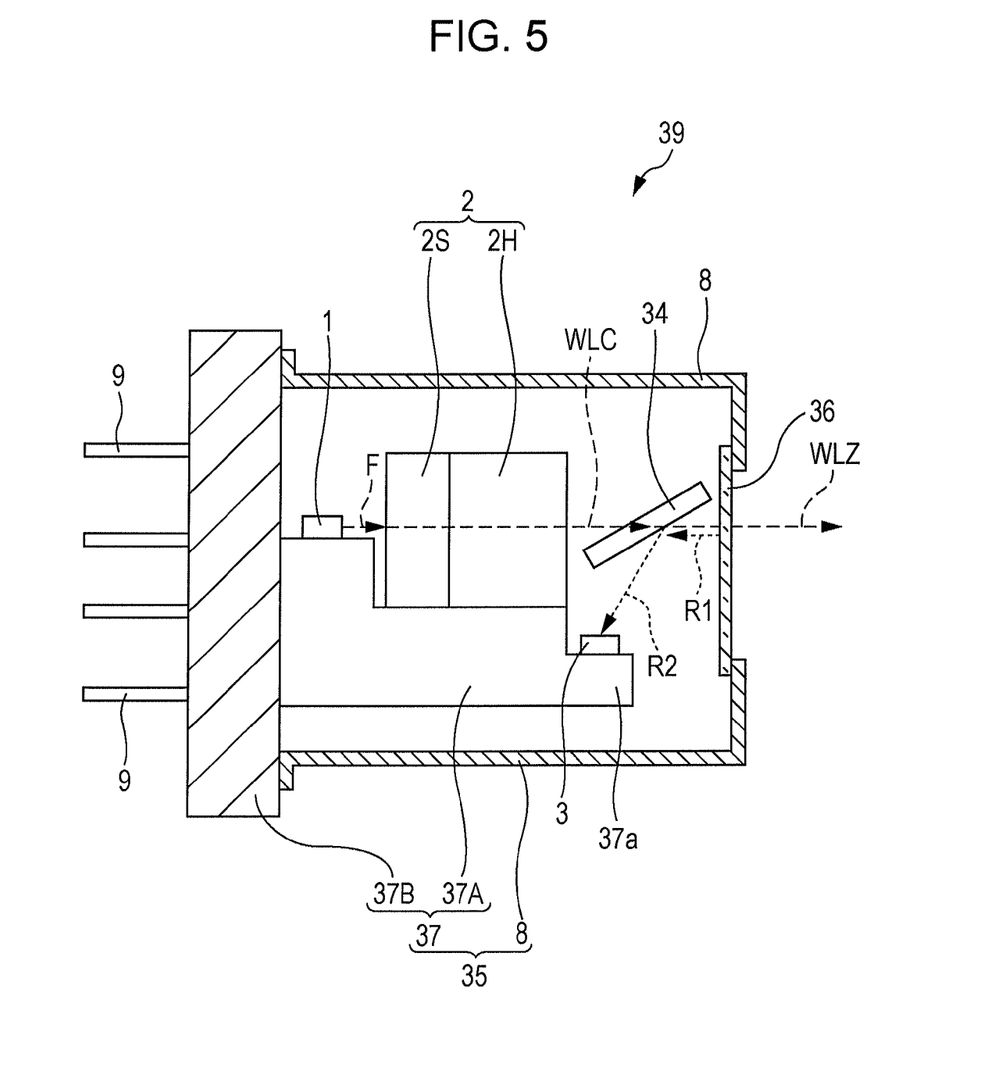
FIG. 5 is a schematic view illustrating a configuration of a semiconductor laser device according to a third embodiment of the present invention.

FIG. 5 is a schematic view illustrating a configuration of a semiconductor laser device 39 according to a third embodiment of the present invention. Differences from the semiconductor laser device 19 of the first embodiment are a filter 34 having an inclination angle different from that of the filter 4, a base member 37 (including a sub-base member 37A and a sub-base member 37B), and a light-transmitting member 36. For simplicity, a fixed portion of the filter 34 in the sub-base member 37A is omitted. The same components as those of the first embodiment are denoted by the same reference numerals and their description will be omitted.

As illustrated in FIG. 5, in the semiconductor laser device 39, the filter 34 has an inclination angle of 60°. Therefore, in the semiconductor laser device 39, the first reflected light R1 is specularly reflected from the filter 34 as the second reflected light R2 at an angle different from that in the semiconductor laser device 19 of the first embodiment. In the semiconductor laser device 39, the photoreceptor 3 is disposed closer to the transducer 2 than the photoreceptor 3 of the semiconductor laser device 19 is to the transducer 2. Thus, since the length of an end portion 37*a* of the sub-base member 37A where the photoreceptor 3 is disposed can be reduced, the size of the semiconductor laser device 39 can be reduced.

In the semiconductor laser device 39 of the present embodiment, the wavelength range light WLZ transmitted through the filter 34 is partially specularly reflected by the light-transmitting member 36, the resulting first reflected light R1 is specularly reflected by the filter 34, and the resulting second reflected light R2 is received by the photoreceptor 3. Therefore, no additional component, such as a beam splitter, is required to monitor the output light for the APC function. In the present embodiment, the filter 34 and the light-transmitting member 36, which is part of a sealing member 35, are used to monitor the output light. Therefore, unlike in the case where a combination of reflecting mirrors is used to monitor the output light, no complex shapes are required, size reduction is possible, and the optical axis of the specularly reflected light R (including the first reflected light R1 and the second reflected light R2) incident on the photoreceptor 3 is easily adjustable. Moreover, since the desired wavelength range light WLZ transmitted through the filter 34 is monitored, a high level of monitoring accuracy can be achieved, because the wavelength range light WLZ does not contain the fundamental wave F, fundamental-wave converted light, and higher-order harmonics. Also, as compared to the case where diffuse reflected light is monitored, a higher level of monitoring accuracy can be achieved, because a larger amount of light can be obtained.

The present invention is not limited to the embodiments described above, and can be appropriately changed without departing from the scope of the present invention.

What is claimed is:

1. A semiconductor laser device comprising:
   a semiconductor laser element configured to emit a fundamental wave;
   a transducer configured to receive incident thereon the fundamental wave and convert a wavelength of the fundamental wave to emit wavelength converted light;
   a filter configured to selectively transmit wavelength range light having a desired wavelength range of the wavelength converted light;
   a sealing member, including a light-transmitting member, configured to enclose the semiconductor laser element, the light-transmitting member being configured to receive the wavelength range light transmitted through the filter and incident on the light-transmitting member, specularly reflect part of the wavelength range light, and substantially transmit the remaining part of the wavelength range light; and
   a photoreceptor configured to receive the specularly reflected light from the light-transmitting member; wherein:
   the fundamental wave emitted from the semiconductor laser element is partially converted by the transducer to the wavelength converted light, which is transmitted through the filter and reaches the light-transmitting member, which specularly reflects part of the wavelength range light transmitted through the filter as first reflected light and substantially transmits the remaining part of the wavelength range light, and the filter specularly reflects the first reflected light as second reflected light, which is received by the photoreceptor.

2. The semiconductor laser device according to claim 1, wherein the filter is disposed such that a direction normal to an emitting side of the filter from which the wavelength range light is emitted is not parallel to an optical axis of the wavelength range light.

3. The semiconductor laser device according to claim 2, wherein the light-transmitting member is disposed such that a direction normal to an incident side thereof where the wavelength range light is incident on the light-transmitting member is parallel to the optical axis of the wavelength range light.

4. The semiconductor laser device according to claim 1, wherein the transducer includes a solid laser configured to emit light of a desired wavelength in response to the fundamental wave incident thereon, and a nonlinear optical element configured to generate a harmonic in response to the emitted light incident thereon from the solid laser.

5. The semiconductor laser device according to claim 1, wherein a transducer side of the filter adjacent to the transducer is provided with an antireflective layer for preventing reflection of the wavelength converted light.

6. The semiconductor laser device according to claim 3, wherein the sealing member includes a base member on which the semiconductor laser element, the transducer, the filter, and the photoreceptor are mounted, and a case configured to join the base member to the light-transmitting member and enclose the semiconductor laser element; and
   the base member has an inclined portion configured to support the filter such that the direction normal to the emitting side of the filter is not parallel to the optical axis of the wavelength range light.

* * * * *